(12) United States Patent
Burckel et al.

(10) Patent No.: US 8,981,337 B1
(45) Date of Patent: Mar. 17, 2015

(54) MEMBRANE PROJECTION LITHOGRAPHY

(71) Applicant: Sandia Corporation, Albuquerque, NM (US)

(72) Inventors: David Bruce Burckel, Albuquerque, NM (US); Paul S. Davids, Albuquerque, NM (US); Paul J. Resnick, Albuquerque, NM (US); Bruce L. Draper, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/017,132

(22) Filed: Sep. 3, 2013

(51) Int. Cl.
| H01L 29/06 | (2006.01) |
| H01L 47/02 | (2006.01) |
| H01L 21/311 | (2006.01) |
| H01L 21/302 | (2006.01) |
| H01L 21/306 | (2006.01) |

(52) U.S. Cl.
CPC .................................... *H01L 21/306* (2013.01)
USPC ............... 257/7; 438/703; 438/696; 438/700; 438/702; 438/519; 438/525; 438/527

(58) Field of Classification Search
USPC .............. 257/7; 438/703, 696, 700, 702, 519, 438/525, 527
See application file for complete search history.

(56) References Cited

U.S. PATENT DOCUMENTS

| 6,204,815 | B1 | 3/2001 | Lesea et al. | |
| 8,197,887 | B1* | 6/2012 | Burckel | 427/97.7 |
| 2002/0145489 | A1* | 10/2002 | Cornett et al. | 333/197 |
| 2002/0166218 | A1* | 11/2002 | Barber | 29/25.35 |
| 2006/0138429 | A1* | 6/2006 | Heo | 257/72 |

OTHER PUBLICATIONS

Ishihara, et al., "Monolithic 3D-ICs with single grain Si thin film transistors", Solid-State Electronics, 2012, pp. 80-87.
Matthias, et al., "Paradigm changes in 3D-IC manufacturing", Solid State Technology—3D Integration, Jul. 2013, pp. 29-40.
Akasaka, Y., "Three-Dimensional IC Trends", Proceedings of the IEEE, Dec. 1986, vol. 74, No. 12, pp. 1703-1714.
Moers, J., "Turning the world vertical: MOSFETs with current flow perpendicular to the wafer surface", Applied Physics a Materials Science and Processing, 2007, vol. 87, pp. 531-537.
Lai, et al., "Wafer-level three-dimensional integrated circuits (3D IC): Schemes and key technologies", Microelectronic Engineering 2011, vol. 88, pp. 3282-3286.

(Continued)

*Primary Examiner* — Karen Kusumakar
(74) *Attorney, Agent, or Firm* — Martin I. Finston

(57) ABSTRACT

The various technologies presented herein relate to a three dimensional manufacturing technique for application with semiconductor technologies. A membrane layer can be formed over a cavity. An opening can be formed in the membrane such that the membrane can act as a mask layer to the underlying wall surfaces and bottom surface of the cavity. A beam to facilitate an operation comprising any of implantation, etching or deposition can be directed through the opening onto the underlying surface, with the opening acting as a mask to control the area of the underlying surfaces on which any of implantation occurs, material is removed, and/or material is deposited. The membrane can be removed, a new membrane placed over the cavity and a new opening formed to facilitate another implantation, etching, or deposition operation. By changing the direction of the beam different wall/bottom surfaces can be utilized to form a plurality of structures.

19 Claims, 13 Drawing Sheets

(56) References Cited

OTHER PUBLICATIONS

Aksu, Serap, et al. "High-Throughput Nanofabrication of Infrared Plasmonic Nanoantenna Arrays for Vibrational Nanospectroscopy" Nano Letters, American Chemical Society Jun. 18, 2010, pp. 2511-2518 (first received Mar. 24, 2010).

Bryant, Garnett W., et al. "Mapping the Plasmon Resonances of Metallic Nanoantennas" Nano Letters 2008, vol. 8, No. 2, pp. 631-636; American Chemical Society Jan. 12, 2008 (first received Nov. 21, 2007).

Burckel, D. Bruce et al. "Fabrication of 3D Metamaterial Resonators Using Self-Aligned Membrane Projection Lithography" Sandia National Laboratories, Albuquerque, NM; Wiley InterScience, Advanced Materials Jun. 8, 2010, 22, pp. 3171-3175 (first received Dec. 3, 2009).

Burckel, D. Bruce et al. "Micrometer-Scale Cubic Unit Cell 3D Metamaterial Layers" Sandia National Laboratories, Albuquerque, NM; Wiley InterScience, Advanced Materials Oct. 13, 2010, 22, pp. 5053-5057 (first received Jul. 6, 2010).

Burckel, D. Bruce et al. "Dynamic Membrane Projection Lithography" Sandia National Laboratories, Albuquerque, NM; 2011 Optical Society of America (7 pages).

Gross, L., et al. "Fabrication of ultrathin magnetic structures by nanostencil lithography in dynamic mode" Applied Physics Letters 90, Mar. 1, 2007 American Institute of Physics, 3 pages, (first received Dec. 15, 2006).

Hirose, Kenichiro, et al. "A simultaneous vertical and horizontal self-patterning method for deep three-dimensional microstructures" Journal of Micromechanics and Microengineering, IOP Publishing Ltd Jun. 26, 2007, pp. S68-S76, (first received Dec. 29, 2006).

Kim, Gyuman, et al. "All-photoplastic microstencil with self-alignment for multiple layer shadow-mask patterning" Elsevier B.V. Jun. 4, 2003, www.sciencedirect.com Sensors and Actuators A 107 (2003) pp. 132-136 (first received Jun. 12, 2001).

Knight, Mark W. et al. "Photodetection with Active Optical Antennas" Science vol. 332, pp. 702-704, May 6, 2011 (first received Jan. 19, 2011).

Liu, Jingquan et al. "Fabrication of Hollow Metal 'Nanocaps' and Their Red-Shifted Optical Absorption Spectra" Advanced Materials 2005, 17, pp. 1276-1281, (first received Jan. 7, 2005).

Mirin, Nikolay et al. "Light Bending Nanoparticles" Nano Letters 2009, vol. 9, No. 3, ASC Publications, Feb. 19, 2009 pp. 1255-1259 (first received Jan. 20, 2009).

Takano, Nao et al. "Fabrication of metallic patterns by microstencil lithography on polymer surfaces suitable as microelectrodes in integrated microfluidic systems" Journal of Micromechanics and Microengineering, IOP Publishing Ltd, Jul. 3, 2006 pp. 1606-1613, (first received Mar. 30, 2006).

* cited by examiner

MEMBRANE PROJECTION LITHOGRAPHY

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

An integrated circuit may be composed of a plurality of semiconductor devices, such as transistors or the like, which can be produced by a variety of techniques. To facilitate increased integration and speed of semiconductor devices, a geometrical progression of continuously scaling semiconductor devices (e.g., decreasing transistor size, increasing transistor areal density, etc.) has emerged. Reducing the size of a semiconductor device and/or a feature size of a semiconductor device can provide improved speed, performance, density, cost per unit, etc., of resultant integrated circuits. However, as the size of semiconductor devices and device features have been reduced, conventional fabrication techniques (e.g., lithography) are being challenged in their ability to produce modules comprising a plurality of integrated circuits located with high proximity to each other. For example, fin-field effect transistors (fin-FET) are being manufactured with a 22 nanometer gate, which is a few 10s of atoms across. Hence, the limits of lateral scaling of devices, and their manufacture, are being reached. Accordingly, the Semiconductor Industry Association has recognized the limits of conventional planar manufacture of semiconductor devices and accordingly has identified three dimensional-integrated circuit (3D-IC) fabrication as a core enabler in keeping pace with Moore's Law.

For example, while a fin-FET is topographically a 3D structure, conventional manufacture of a fin-FET is by way of a standard planar process flow. However, it is not possible to extend the planar process flow repetitively in the vertical dimension to capture 3D volumetric scaling of transistor density, and construction of a 3D structure is severely hampered when limited to 2D viewing and processing.

It could be opined that current CMOS having 7-10 layers of metallization are 3D, however these structures can be viewed as the result of a succession of strictly 2D operations. In addition, the phrase 3D-IC is used in the semiconductor industry and literature to describe a subset of devices typically formed by stacking successive functional 2D planar die, and making use of through-wafer vias (or through-silicon vias), or by bonding die in a face-to-face manner. In both forms, the plane containing the transistors and interconnects for each level is parallel to the wafer surface.

Hence, to enable 3D-IC fabrication, where the functional semiconductor devices are fabricated on surfaces which are not parallel to the wafer surface, to be realized, new approaches to semiconductor device manufacture have to be engendered. 3D fabrication is an approach to extending effective areal density, but current methods (e.g., nano-origami, direct laser write, etc.) of 3D fabrication at the sub-micron scale are rare, typically not CMOS-compatible, require non-standard equipment, and lack high-volume manufacturing scalability.

SUMMARY

The following is a brief summary of subject matter that is described in greater detail herein. This summary is not intended to be limiting as to the scope of the claims.

Various exemplary embodiments presented herein relate to forming a 3D structure, e.g., for a semiconductor component. In an exemplary embodiment a method is presented, the method comprising forming a first structure in a cavity in a matrix material, wherein the first structure is formed by one of a first deposition operation, a first implantation operation, or a first etching operation performed through a first opening in a first membrane layer formed over the cavity and the first structure is formed on an inner wall surface of the cavity. The method further comprises forming a second structure on the first structure, wherein the second structure is formed by one of a second deposition operation, a second implantation operation, or a second etching operation performed through a second opening in a second membrane layer formed over the cavity.

Another exemplary embodiment is presented comprising a method for forming a patterned membrane layer over a cavity in a matrix material, wherein the patterned membrane layer comprises at least one mask opening. The method comprises directionally forming at least one structure on an inner wall surface of the cavity through the at least one mask opening in the patterned membrane layer to reproduce the pattern on the inner wall surface, wherein the forming of the at least one structure is one of implanting material into the inner wall surface or removing material from the inner wall surface.

A further exemplary embodiment for forming a 3D structure comprises a computer-readable medium comprising instructions that, when executed by a processor, cause the processor to perform acts comprising forming a first structure in a cavity, wherein the first structure is formed by one of a first deposition operation, a first implantation operation, or a first etching operation and the first structure is formed on an inner wall surface of the cavity. The acts further comprise forming a second structure on the first structure, wherein the second structure is formed by one of a second deposition operation, a second implantation operation, or a second etching operation.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
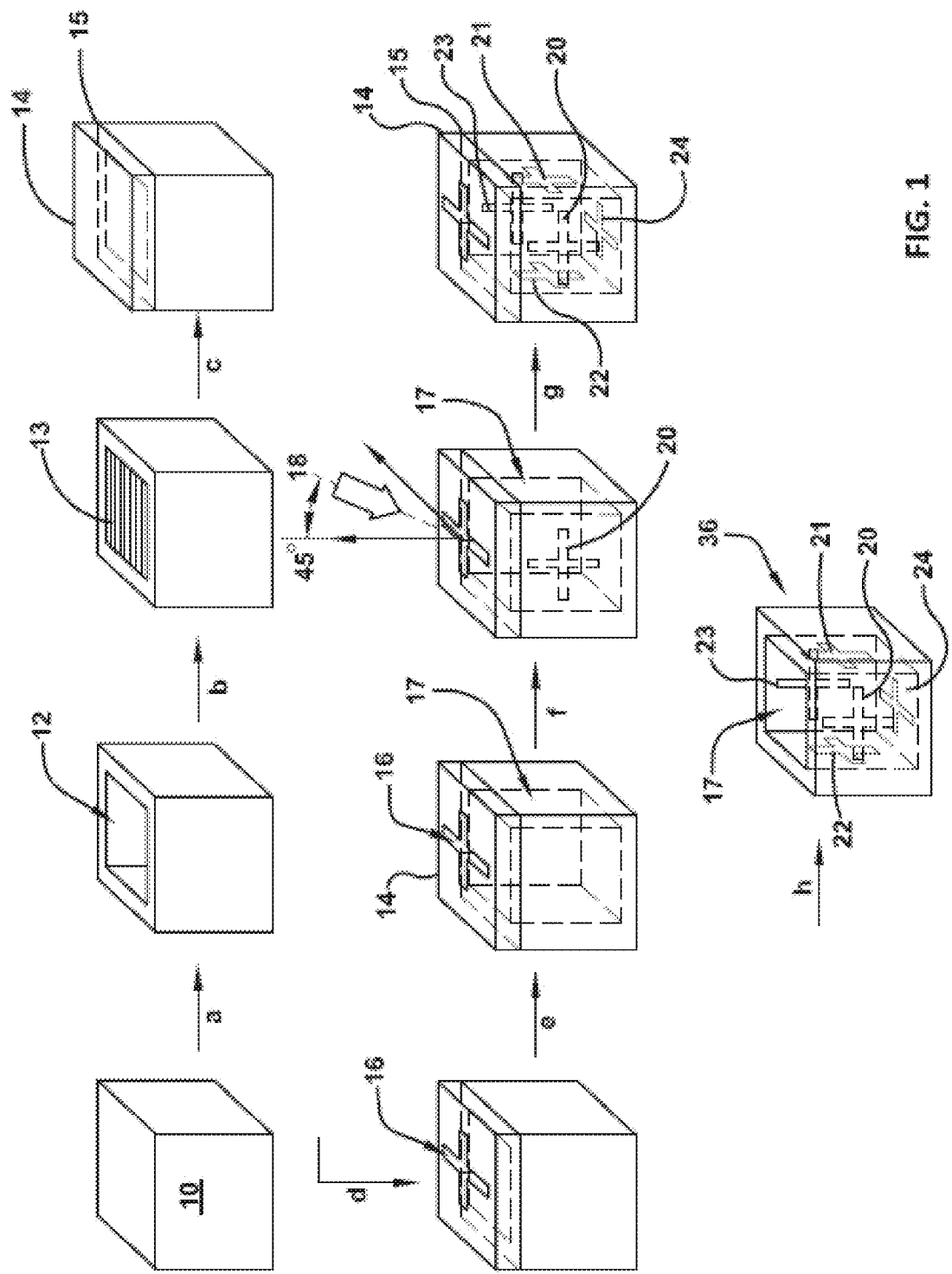
FIG. 1 illustrates a block diagram of various stages involved in an implantation operation utilizing MPL technology, according to an embodiment.

Various technologies pertaining to manufacture of 3D structures are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

As noted above, exemplary embodiments presented herein relate to formation of 3D structures (e.g., IC's) at both the device level and the system level. The exemplary embodiments presented herein further relate to application of these 3D structures to hybrid technologies such as complementary metal-oxide-semiconductor (CMOS)/photonic and CMOS/biological applications, as well as other applicable structures, such as diodes, MOS capacitors, bipolar transistors, photovoltaics, memory/storage devices, etc. Further, in an example, the various embodiments presented herein relate to membrane projection lithography (MPL), a microfabrication technique where directional deposition through a suspended, patterned membrane can be utilized to create micron-scale 3D structures, for example. The fabrication approach can also include such techniques as patterned etching and patterned ion implantation, combined with blanket processes such as oxidation, CVD deposition and planarization.

To facilitate understanding of the various embodiments presented herein, FIG. 1 is a block diagram of various stages involved in an implantation (e.g., ion implantation) operation utilizing MPL technology. The stages presented can be further extended to etching and material deposition as further described herein. For the purpose of illustration, the various embodiments presented herein are described with respect to a single unit cell of a matrix material 10, where the matrix material can effectively act as a substrate in more than one dimension. However, the various embodiments are applicable to fabrication of arrays of unit cells using standard semiconductor processing equipment and materials, as will be apparent from the description that follows, particularly FIGS. 7A-7D, FIG. 15 and FIG. 16. The choice of the matrix material can depend on the desired electromagnetic performance, structural and processing characteristics, for example, a silicon-containing material which can be in a monocrystalline form as well as a polycrystalline form depending upon the final device application, as well as other semiconductors such as gallium arsenide and germanium, and dielectrics such as silica and silicon dioxide. Further, the matrix material can include a non-electrical material such that a 3D structure can be formed thereon, and the underlying matrix material is not involved with operation of the 3D structure. At step 1a, a cavity 12 is formed in each unit cell of the matrix material 10. The cavity 12 can be formed by any suitable technique such as etching a void into a block of matrix material or by depositing the bottom and side walls of matrix material to form the cavity (e.g., lithographically, etc.). At step 1b, a sacrificial backfill material 13 can be deposited into the cavity 12 and planarized to support a subsequent membrane layer 14. The sacrificial backfill material 13 can later be selectively removed using any suitable technique such as by an etching or dissolution mechanism, whereby the suitable technique can be a material selective technique configured to not affect any of the membrane, the matrix material, or other materials included in structures formed on the cavity wall(s). Exemplary sacrificial backfill materials include silicon (Si), silicon dioxide ($SiO_2$), polyimide, photoresist, etc. At step 1c, the membrane layer 14 is deposited on the planarized backfill material 13. Exemplary membrane materials include photoresists, Si, $SiO_2$, silicon nitride (SiN), metals, and nitrides or other compounds of metals such as aluminum, chromium, and titanium, for example, thus including by way of example, AlN, CrN, TiN, etc. The membrane layer 14 material can be subsequently removed with a selective etchant or be chemically mechanically polished (CMP) off. Alternatively, a release layer 15 can be deposited prior to formation of the membrane layer 14 to enable subsequent lift off of the membrane. At step 1d, the membrane layer 14 can be patterned, e.g., with standard lithographic techniques (e.g. e-beam, stepper, scanner, interferometric lithography, nano-imprint lithography, screen printing contact mask exposure, shadow mask, etc.), to provide a mask opening 16 that images the desired structure (e.g., a patterned cross in this example). One significant advantage to this approach is that the membrane is polished flat prior to patterning, so extremely shallow depth-of-focus lithography systems such as modern steppers can still be used to create the requisite patterns. At step 1e, the sacrificial backfill material 13 can then be removed through the mask opening 16 to provide a cavity 12 underneath the suspended patterned membrane layer 14.

A region, or structure, can be formed by an implantation operation on a wall 17 of the cavity 12 using consecutive off-normal and/or normal implantation of a material (e.g., an ion beam) through the mask opening 16. The implantation operation (and also the etching and deposition operations presented herein) can be conducted under vacuum (e.g., high vacuum) such that the implanted material region (and similarly the etched and deposited structures) accurately replicates the membrane pattern. For example, at step 1f, a first directional implantation 18 of material can be made with an implantation source tilted at 45° away from the mask normal N (e.g., at 45° into the plane of the figure), thereby implanting material (e.g., ions) in a first region 20 on the inside of the front wall of the cavity 12. The top of the membrane layer 14 can also be coated with implantation material. In a deposition operation, any build-up of material deposited onto the membrane layer 14 can be removed prior to a next deposition being performed with the membrane layer 14 to prevent occlusion of the opening 16.

At step 1g, further implantations can be made with the implantation source tilted at 45° away from the mask normal N and spread out 90° azimuthally from the first implantation in the plane of FIG. 1, thereby forming a second implanted region 21 on another interior side wall 12 of the cavity 12. Two additional off-normal implantations and a normally aligned implantation results in three additional regions 22, 23, and 24 being formed on the interior side, back, and bottom walls of the cavity 12. At 1h, the membrane layer 14 can be removed (e.g., by selective etching of the membrane layer 14, or by lift off of release layer 15) to provide a unit cell 36 comprising a plurality of implanted regions 20-24 formed on the inner walls 17 of the exposed cavity 12.

It is to be appreciated that while the various embodiments illustrated herein depict a cavity having a cubic profile/structure, the embodiments are not so limited and the cavity can be formed to any desired shape such as curved, cylindrical, spherical, ellipsoidal, prismatoidal, conic, etc.

Figure 2:
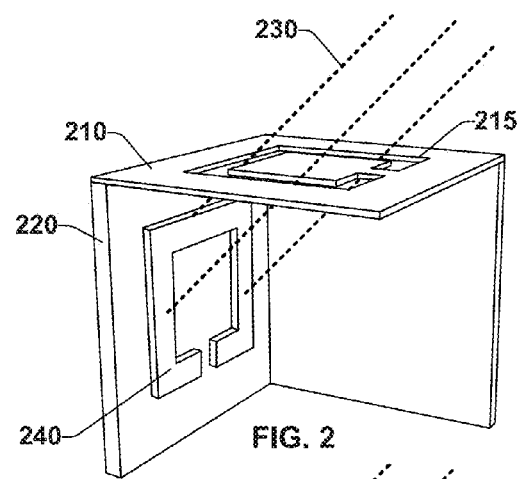
FIG. 2 illustrates a deposition operation being undertaken with an MPL technique, according to an embodiment.
Figure 3:
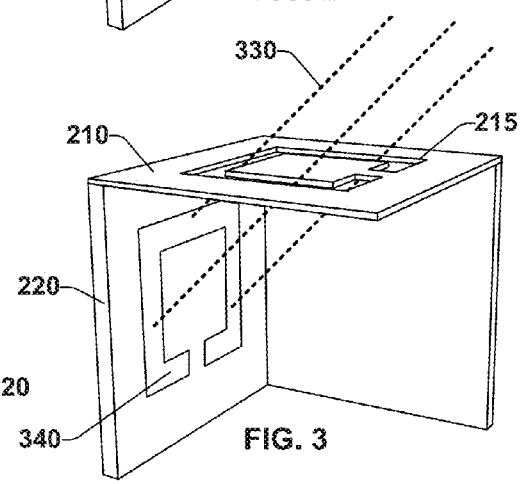
FIG. 3 illustrates an implantation operation being undertaken with an MPL technique, according to an embodiment.
Figure 4:
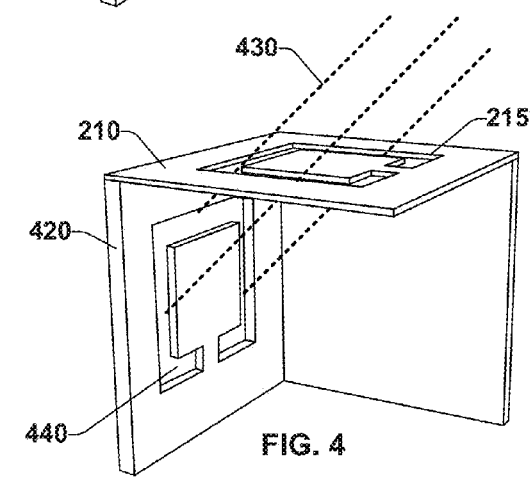
FIG. 4 illustrates a material removal operation being undertaken with an MPL technique, according to an embodiment.

As mentioned, the exemplary technique presented in FIG. 1 can be extended to be applicable to both a deposition operation(s) and an etching operation(s). FIGS. 2-4 illustrate the respective operations of deposition, implantation, and etching being undertaken with the MPL technique, according to one or more embodiments. FIG. 2 illustrates a cell having walls 220 with a membrane layer 210 formed thereon. Membrane layer 210 has a pattern 215 formed therein (e.g., by lithography) which forms the basis for the shape of the deposited structure 240. Structure 240 is formed based on a volume of deposition material 230, which passes through pattern 215 to be deposited on an inner surface of cell wall 220. Deposition can be conducted under vacuum, e.g., a high vacuum deposition operation (such as e-beam evaporation or physical vapor deposition (PVD)) such that the deposited structure accurately replicates the membrane pattern. FIG. 3 illustrates an implantation technique (e.g., ion implantation) and can effectively be considered the structure formed in FIG. 1, step 1f.

FIG. 3 presents a structure comprising of a cell having walls 220 with a membrane layer 210 formed thereon. Membrane layer 210 has a pattern 215 formed therein (e.g., by lithography), which forms the basis for the shape of the implanted region 340. Region 340 is formed based on a volume of material (e.g., ions) in an implantation beam 330 (e.g., an ion implantation beam) which passes through pattern 215 to be implanted on an inner surface of cell wall 220.

FIG. 4 illustrates a material removal operation, e.g., an etching operation such as reactive ion etch (RIE), inductively coupled plasma (ICP) etch, ion beam milling, etc. FIG. 4 presents a structure comprising of a cell having walls 420 with a membrane layer 210 formed thereon. Membrane layer 210 has a pattern 215 formed therein (e.g., by lithography), which forms the basis for the shape of the etched structure or region 440. Structure 440 is formed based on a volume of etchant 430 (e.g., where the etchant is acting in a bombarding and/or abrasive manner) that passes through pattern 215 to impinge on an inner surface of cell wall 420. Based upon a particular order of operations of deposition, etching, implantation, a structure such as a transistor can be formed.

Figure 5:
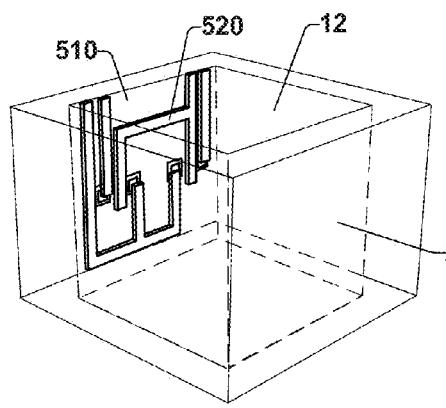
FIG. 5 illustrates a structure formed by utilizing a plurality of deposition, etching, and/or implantation operations, according to an embodiment.

FIG. 5 illustrates a structure 520 (e.g., after final membrane removal) formed on inner wall surface 510 of cavity 12 of cell structure 220. As described further herein, by utilizing a plurality of deposition, etching, and/or implantation operations in conjunction with a plurality of membrane/pattern formations and removal of the backfill material various structures can be formed. As shown in FIGS. 2-4, the formation of the membrane layer 210 and the opening 215 can be performed utilizing conventional equipment as utilized in a CMOS fabrication operation, for example, with the 3D structure being conducted in the 3D space beneath the membrane layer 210.

Figure 6:
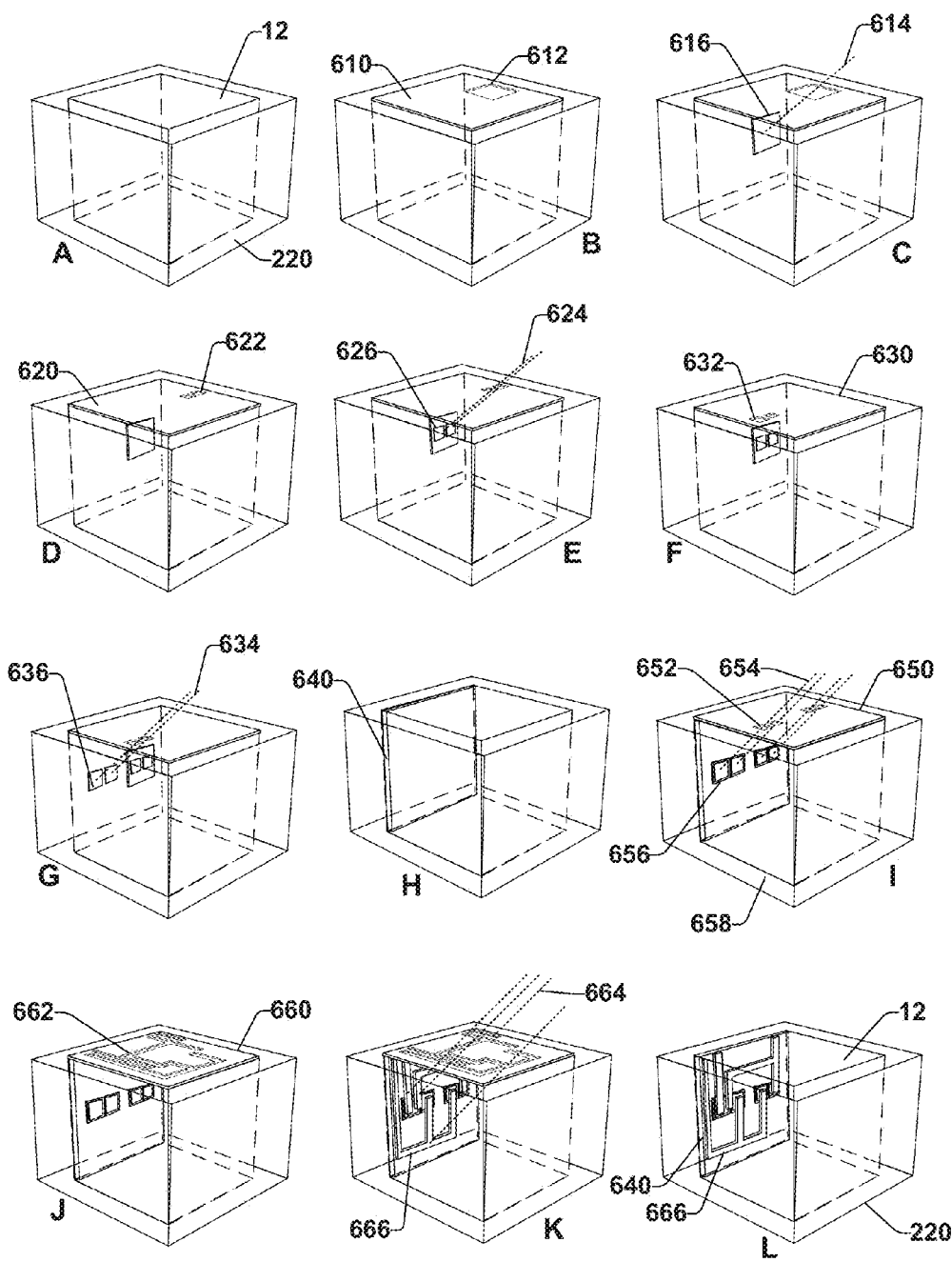
FIG. 6 presents a series of block diagrams illustrating a formation of a semiconductor structure, according to an embodiment.
Figure 7:
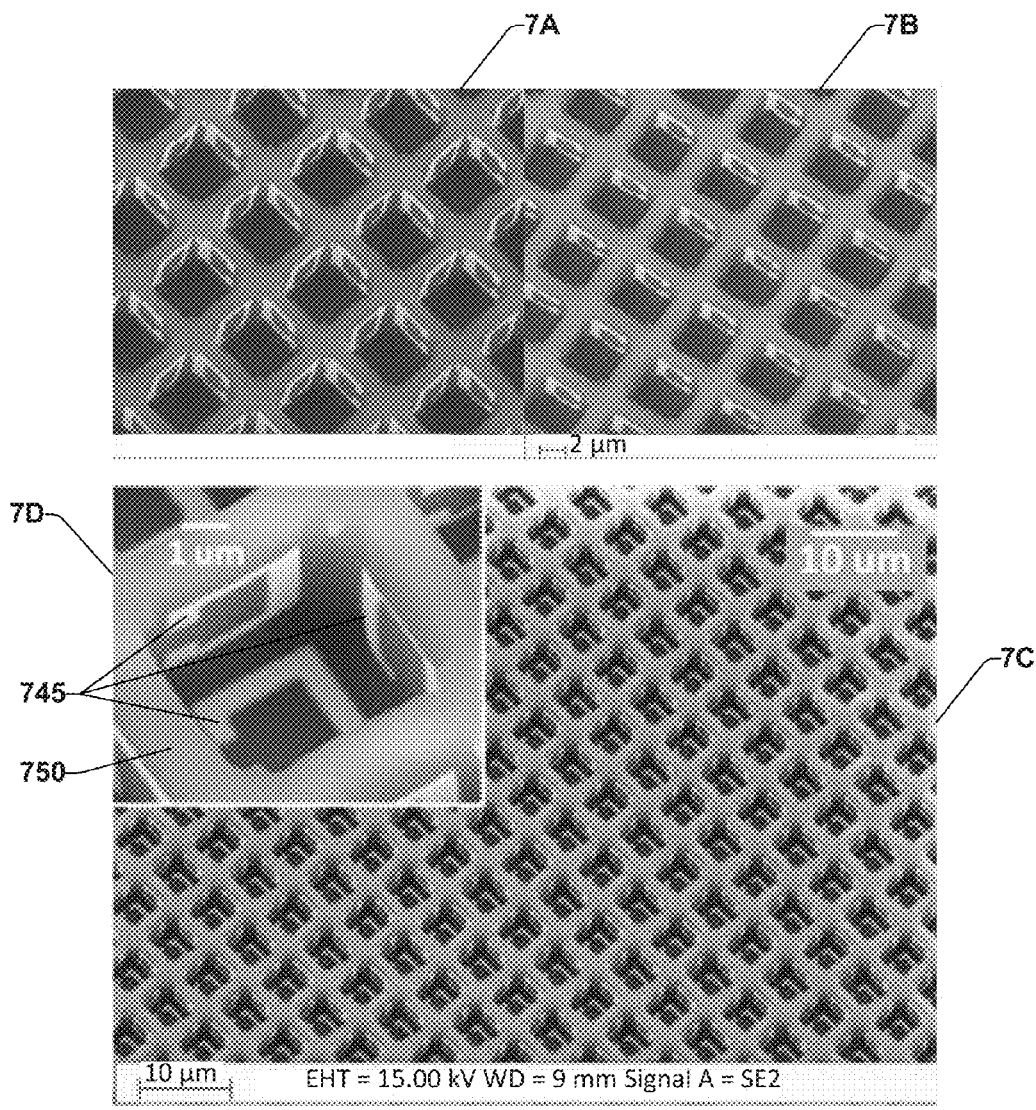
FIGS. 7A, 7B, 7C and 7D present a plurality of photomicrographs of various structures fabricated according to at least one embodiment.

FIG. 6 presents a series of block diagrams illustrating a formation of a semiconductor structure such as a CMOS inverter. At 6A, a cavity 12 is formed in each unit cell of a matrix material 220, where the cavity has a desired depth and width. The cavity 12 can either be formed by any suitable technique such as via etching a void or by depositing the bottom and side walls of the cavity. As described with reference to FIG. 1, a sacrificial backfill material (e.g., material 13) can be deposited into the cavity 12 and planarized to support a subsequent membrane layer being formed thereon. At 6B, a membrane layer 610 can be formed over the backfill material (as previously discussed) and an opening 612 formed in the membrane layer 610, whereby the opening 612 can have a shape of an n-well structure. As previously mentioned, the backfill material can be removed (e.g., by sacrificial etch).

At 6C an implantation process can be conducted, whereby a stream 614 of implanting material (e.g., an ionized beam) can be directed onto an interior wall surface of cell 220 via the opening 612 to facilitate implantation of an n-well structure 616. Subsequent to FIG. 6C (and also subsequent to FIGS. 6E, 6G and 6I), while not shown but as presented in FIG. 1, the membrane layer 610 (and also subsequently formed respective layers 620, 630, and 650) can be removed, the cavity 12 reopened and refilled with a sacrificial backfill material (e.g., material 13) and the backfill material planarized to support a subsequent membrane layer (e.g., respective layers 620, 630, 650, and 660) being formed thereon.

At 6D a membrane layer 620 can be formed over the backfill material (as previously discussed) and one or more openings 622 can be formed in the membrane layer 620, whereby the opening(s) 622 can have a shape of a pair of P-type metal-oxide-semiconductor (PMOS) source/drain implant structures. At 6E an implantation process can be conducted whereby a stream(s) 624 of implanting material (e.g., an ionized beam) can be directed on to the interior wall surface of cell 220 via the opening(s) 622 to facilitate implantation of the PMOS source/drain implant structures 626. Membrane 620 can be removed and at 6F a membrane layer 630 can be formed over the backfill material (as previously discussed) and one or more openings 632 can be formed in the membrane layer 630, whereby the opening(s) 632 can have a shape of a pair of N-type metal-oxide-semiconductor (NMOS) source/drain implant structures.

At 6G an implantation process can be conducted whereby a stream(s) 634 of implanting material can be directed on to the interior wall surface of cell 220 via the opening(s) 632 to facilitate implantation of the NMOS source/drain implant structures 636. Membrane 630 can be removed and at 6H an oxide layer 640 can be deposited/grown on the interior wall surface of cell 220, whereby in an embodiment, the oxide layer 640 can be formed over the respective PMOS source/drain implant structures 626 and the NMOS source/drain implant structures 636.

At 6I a membrane layer 650 can be formed over the backfill material (as previously discussed) and one or more openings 652 can be formed in the membrane layer 650, whereby the opening(s) 652 can have a shape of the pair of NMOS source/drain implant structures 636 and the PMOS source/drain implant structures 626. An etching process can be conducted whereby a stream(s) 654 of etchant can be directed, via the one or more opening(s) 652 to facilitate removal of a portion of the oxide layer 640 to expose the underlying pair of NMOS source/drain implant structures 636 and the PMOS source/drain implant structures 626.

At 6J a membrane layer 660 can be formed over backfill material (as previously discussed) and one or more openings 662 can be formed in the membrane layer 660, whereby the opening(s) 662 can have a shape of the various interconnects utilized to couple the pair of NMOS source/drain implant structures 636 and the PMOS source/drain implant structures 626, as required, e.g., to form a transistor structure. At 6K a deposition process can be conducted, whereby a stream(s) 664 of depositing material (e.g., as required to form the interconnects such as Al, Cu, or other conductor) can be directed on to the interior wall surface of cell 220 via the opening(s) 664 to facilitate formation of the interconnects 666.

At 6L, membrane 660 can be removed with the desired structure formed on the interior wall surface of cell 220, e.g., comprising of a pair of NMOS source/drain implant structures 636, the PMOS source/drain implant structures 626, an n-well structure 616, an oxide layer 640 and interconnects 666. As illustrated in FIG. 6, a plurality of structures can be formed at each respective stage (e.g., FIGS. 6C, 6E, 6G, 6H, 6I, and 6K) to facilitate formation of a transistor structure on each of the one or more interior walls, e.g., any of the interior right side wall, the interior left side wall, the interior front wall, the interior back wall, and the bottom wall of the cavity 12 (e.g., as represented by unit cell comprising a plurality of structures 20-24 implanted on the inner walls 17 of the exposed cavity 12 depicted in FIG. 1).

It is to be appreciated that while the foregoing embodiments relate a sequence of operations whereby a first membrane is formed, patterned, and then removed, the first membrane can remain and a second membrane formed over the first membrane. Hence, formation of the second membrane may cover or fill any existing openings formed in the first membrane, whereby patterning of the second membrane can also form an opening in the first membrane. After any of the implantation, deposition, or the etching processes are conducted to form the desired structure on the interior wall(s) the second membrane and first membrane can be jointly removed.

FIGS. 7A-7D present a plurality of photomicrographs of various cell matrix structures fabricated utilizing various embodiments presented herein. As illustrated in photomicrograph 7D, a plurality of structures 745 have been formed on respective side walls and base of a cavity (e.g., FIG. 1, cavity 12) formed in a cell structure having walls 750.

Figure 8:
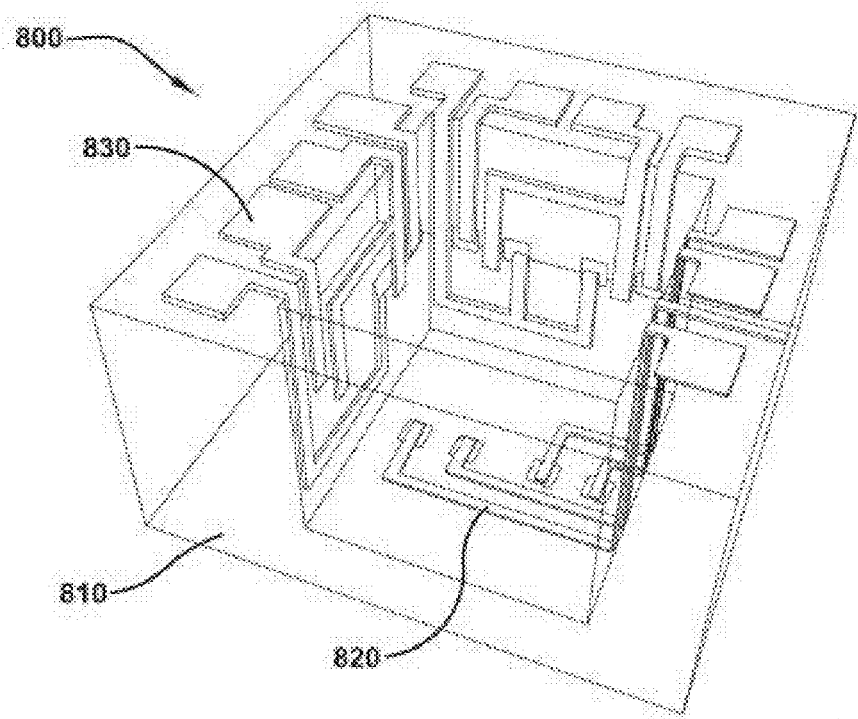
FIG. 8 illustrates a block diagram representation of a semiconductor structure, according to an embodiment.

FIG. 8 is a block diagram representation of a semiconductor structure in accordance with an embodiment. While the preceding discussion has presented a structure(s) formed in a cavity, the various embodiments presented herein can be extended such that a plurality of interconnects 820 formed in a cell structure 810 can be further processed such that a necessary number of connections 830 can be formed on the periphery of the cell cavity (e.g., FIG. 1, cavity 12) such as on the upper surface of the cell walls of cell structure 810, as depicted.

Figure 9:
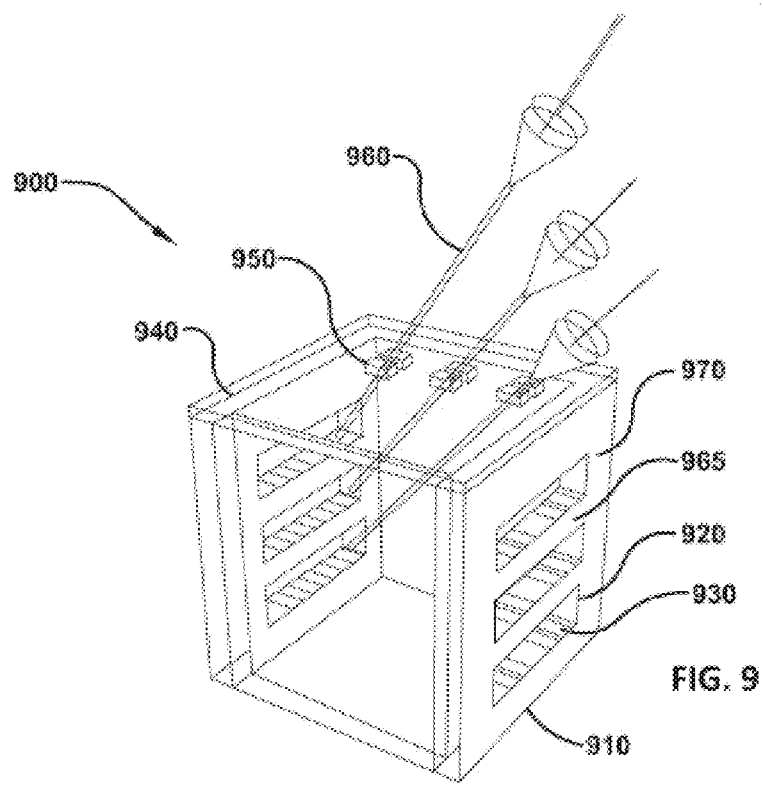
FIG. 9 illustrates a block diagram representation of a semiconductor structure, according to an embodiment.

FIG. 9 is a block diagram representation of a semiconductor structure in accordance with an embodiment. While the preceding discussion has presented a structure(s) formed on at least one of the walls and base of a cavity formed in a cell structure, in an alternative embodiment, at least one cavity 920 can be formed in at least one wall 910 of cell structure. By utilizing a membrane 940 with at least one opening 950 formed therein, as previously described, by utilizing a respective alignment of at least one beam 960 associated with at least one of a deposition operation, an etching operation, or an implantation process, at least one structure 930 can be formed on a surface of the cavity 920 in the at least one wall 910 of the cell structure. In an embodiment, the matrix of structure 900 can be formed from a plurality of stacked planar epitaxial Si layers, e.g., 965 and 970, to facilitate formation of the at least one cavity 920.

Figure 10:
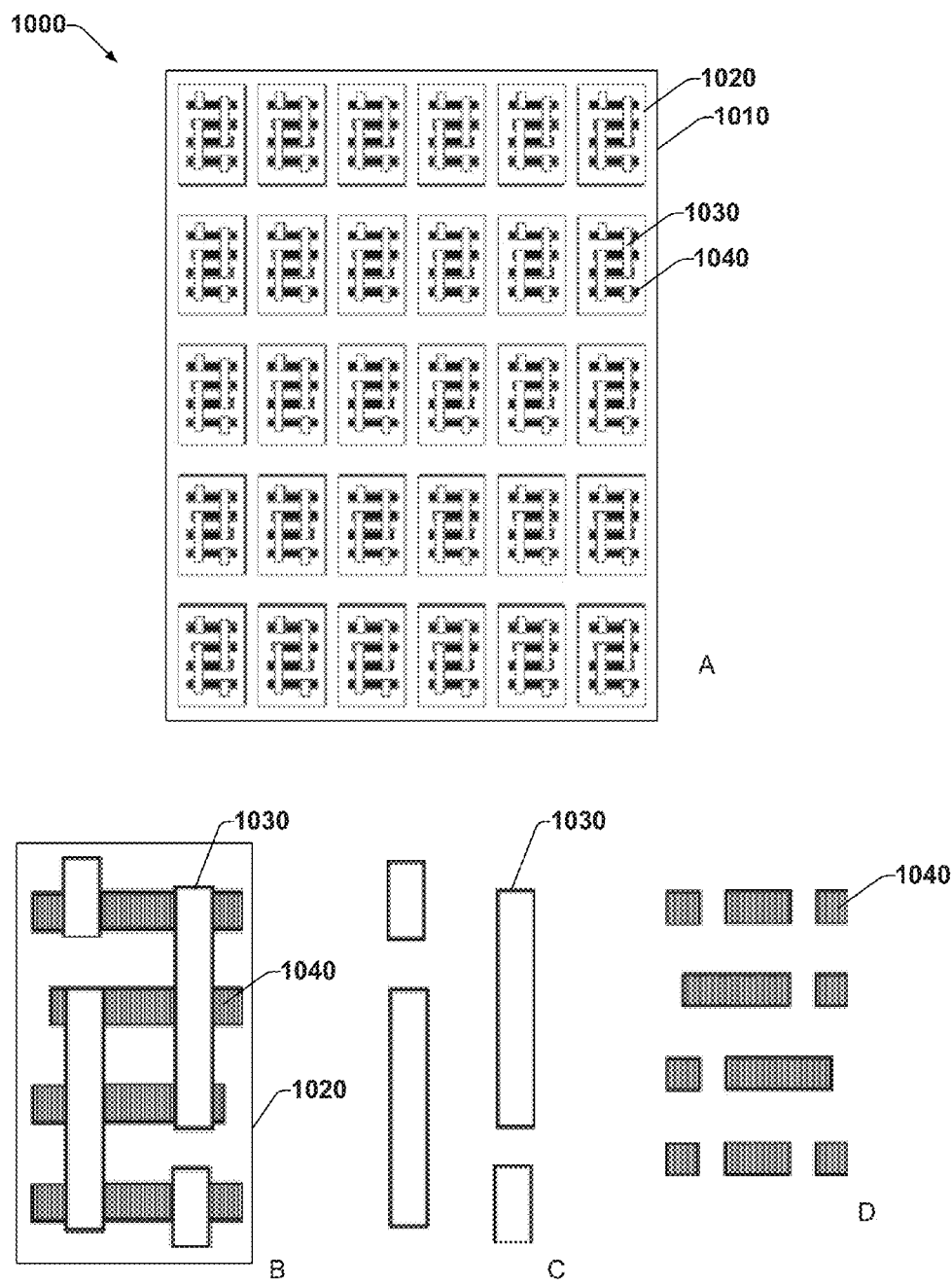
FIGS. 10A, 10B, 10C, and 10D depict representations of a semiconductor structure.

FIG. 10 is a block diagram representation of a fabrication 1000 comprising of at least one semiconductor structure. As shown in FIG. 10, the fabrication component 1000 can include a plurality of semiconductor components 1020. Of concern to an IC manufacturer is the ability for another entity, e.g., a competitor, to be able to reverse engineer a product produced by the IC manufacturer. Such backward engineering can facilitate understanding of how an IC is constructed in terms of location of any of NMOS and/or PMOS sources/drains, interconnects, vias, gates, etc. With such understanding the competitor can determine construction of the IC and hence make unauthorized copies, determine how to improve of the construction of the IC, etc. Any process can be undertaken as part of the reverse engineering operation, such as chemical-mechanical planarization (CMP), to remove the various layers which can comprise an IC. Thus as depicted in FIG. 10, by constructing an IC with a conventional planar approach, the various layers, e.g., the gate level 1030 and source/drain level 1040, can be readily reverse engineered by a simple operation of CMP from which the respective location, thickness, composition, etc., of the gate(s) level components 1030, the source/drain level components 1040, etc., can be readily determined.

Figure 11:
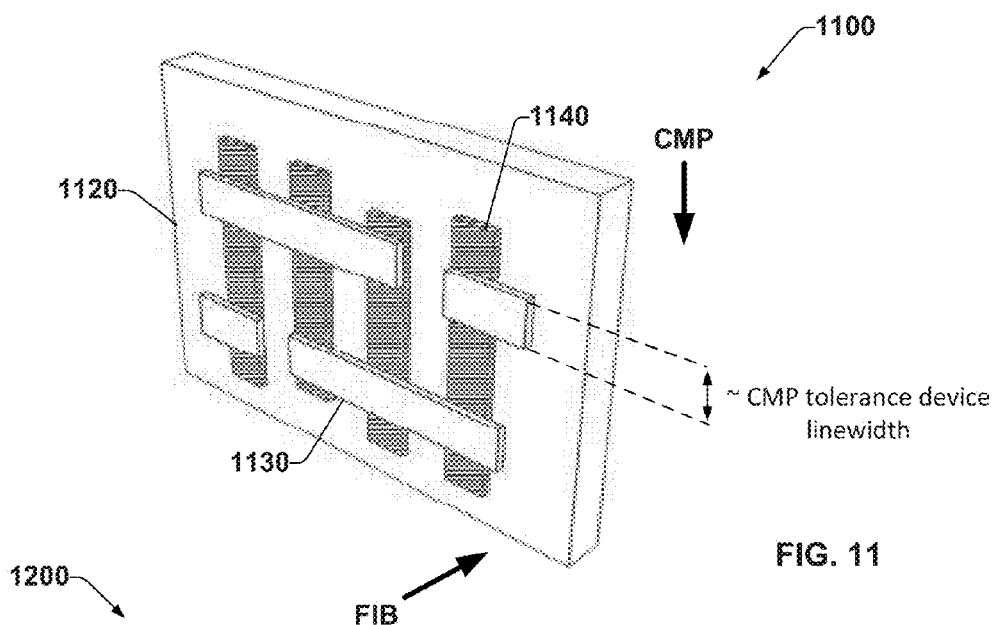
FIG. 11 illustrates a block diagram representation of a semiconductor structure, according to an embodiment.
Figure 12:
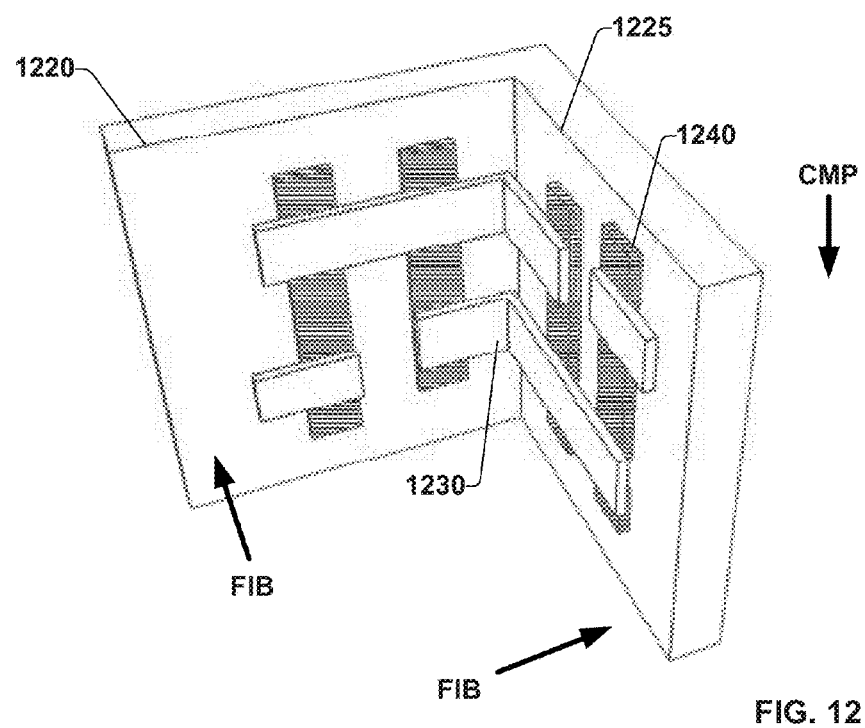
FIG. 12 illustrates a block diagram representation of a semiconductor structure, according to an embodiment.

However, as shown in FIGS. 11 and 12, by constructing semiconductor components in a 3D arrangement, reverse engineering the resulting IC can be much harder than reverse engineering a conventionally fabricated IC. For example, component 1110 comprises of a transistor structure where the gate structure 1130 and the source/drain structure 1140 have been formed on a vertical wall 1120. Hence, in the exemplary structures presented in FIGS. 7A-7D, where at least one structure (e.g., structure 745) can be formed vertically on any of the side walls as well as in the base of the cell structure, to reverse engineer an IC fabricated in accordance with the various embodiments presented herein can be complicated. For example, as indicated in FIG. 11, the depth to which a CMP operation occurs can be very hard to determine as a feature (e.g., a gate, source/drain, interconnect, via, etc.) may be completely removed during the CMP operation (e.g., a CMP slice) without an operator knowing. Also, a focused ion beam (FIB) operation can be utilized to gain further understanding of the structure of component 1110, e.g., by milling material away from a component. However, the FIB operation may be undertaken in a direction orthogonal to the direction of the CMP operation, which can further obfuscate knowledge of a construction of component 1110. For example, material is being removed in the vertical direction by a CMP process while the FIB operation is removing material in the horizontal plane of FIG. 11. Hence, it is difficult to ascertain how much material is being removed and where such material is being removed from by the respective CMP and FIB operations.

Further, as illustrated in FIG. 12, when two or more cell surfaces (e.g., surfaces 1220 and 1225) are aligned to each other with approximate orthogonality, uncertainty regarding feature removal is heightened. In addition, the uncertainty regarding various features (e.g., gate structures 1230, drain structures 1240) being removed during each stage of a CMP operation can be further exacerbated by a FIB operation being undertaken in at least one direction orthogonal to the CMP operation. At the system level, a 3D-IC can be inherently more difficult to reverse engineer than a conventional planar structure, as not only the individual device structure, but the interconnection topology can be distributed in all three dimensions. Hence even if the individual device structure can be resolved, creating a 3D map of the logic flow can be more difficult than with a 2D planar device. Thus, by utilizing the various embodiments herein, advantage can be taken of an IC that can be constructed that can require a complicated reverse engineering process(es) to facilitate understanding of the structure of the IC.

Figure 13:
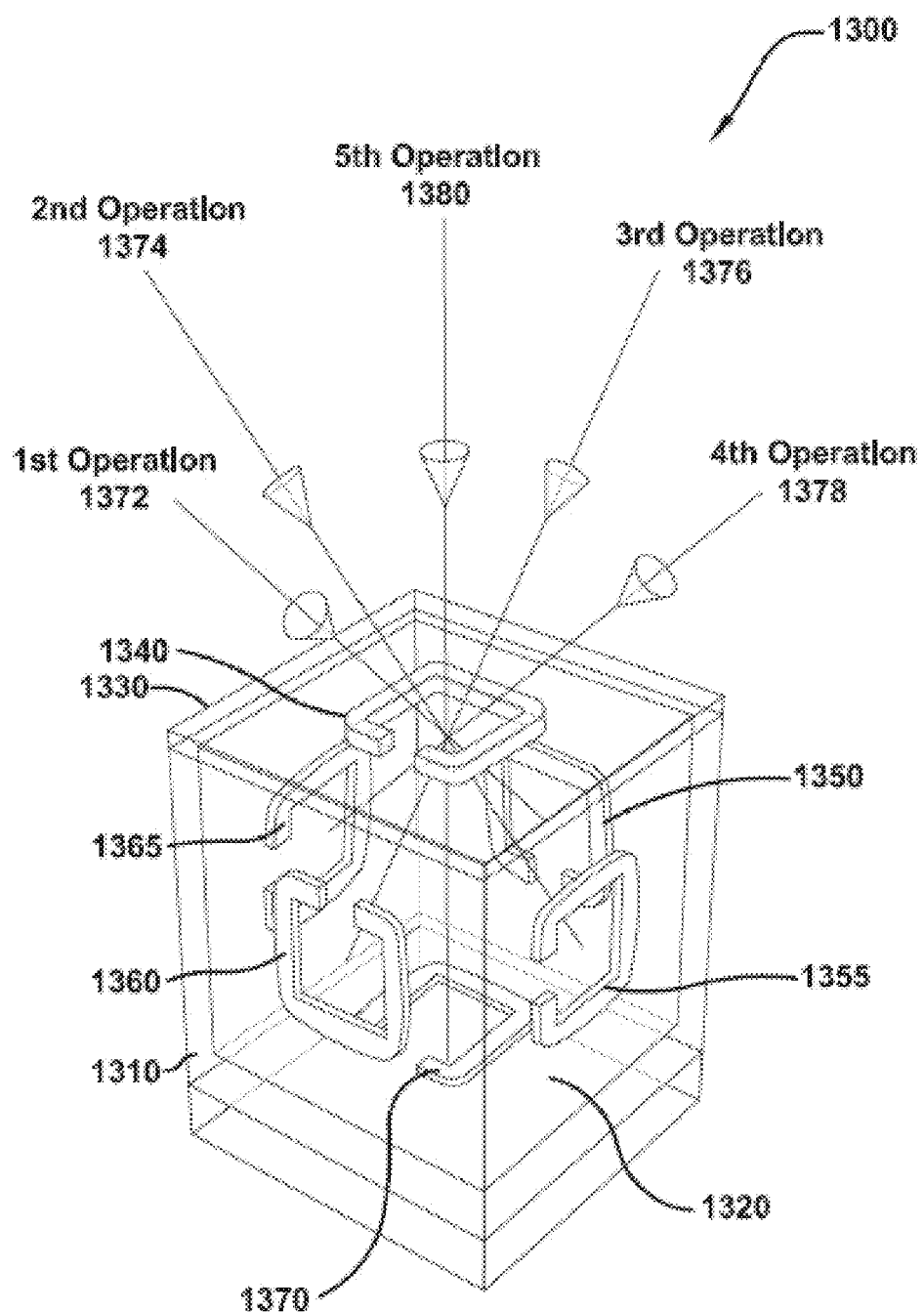
FIG. 13 illustrates formation of a plurality of structures according to a variation of beam directions, in accordance with an embodiment.

FIG. 13 illustrates varying the direction of a beam involved in forming a particular structure in structure 1300 relative to the location of an opening in a membrane layer. Structure 1300 comprises a matrix material 1310 into which a cavity 1320 has been formed, and further a membrane layer 1330 has been formed over the cavity 1320. Membrane layer 1330 has an opening 1340 formed therein. On the respective four sidewalls and bottom surface of cavity 1320 a plurality of structures are to be formed, with structures 1350, 1355, 1360, and 1365 located on the sidewalls and structure 1370 located on the bottom surface. By altering the angle of a beam associated with any of a deposition operation, an etching operation, or an implantation operation, each of the structures 1350-1370 can be formed. For example, beam 1372 facilitates formation of structure 1350, beam 1374 facilitates formation of structure 1355, beam 1376 facilitates formation of structure 1360, beam 1378 facilitates formation of structure 1365, and beam 1380 (orthogonal to a plane of the opening) facilitates formation of structure 1370.

Figure 14:
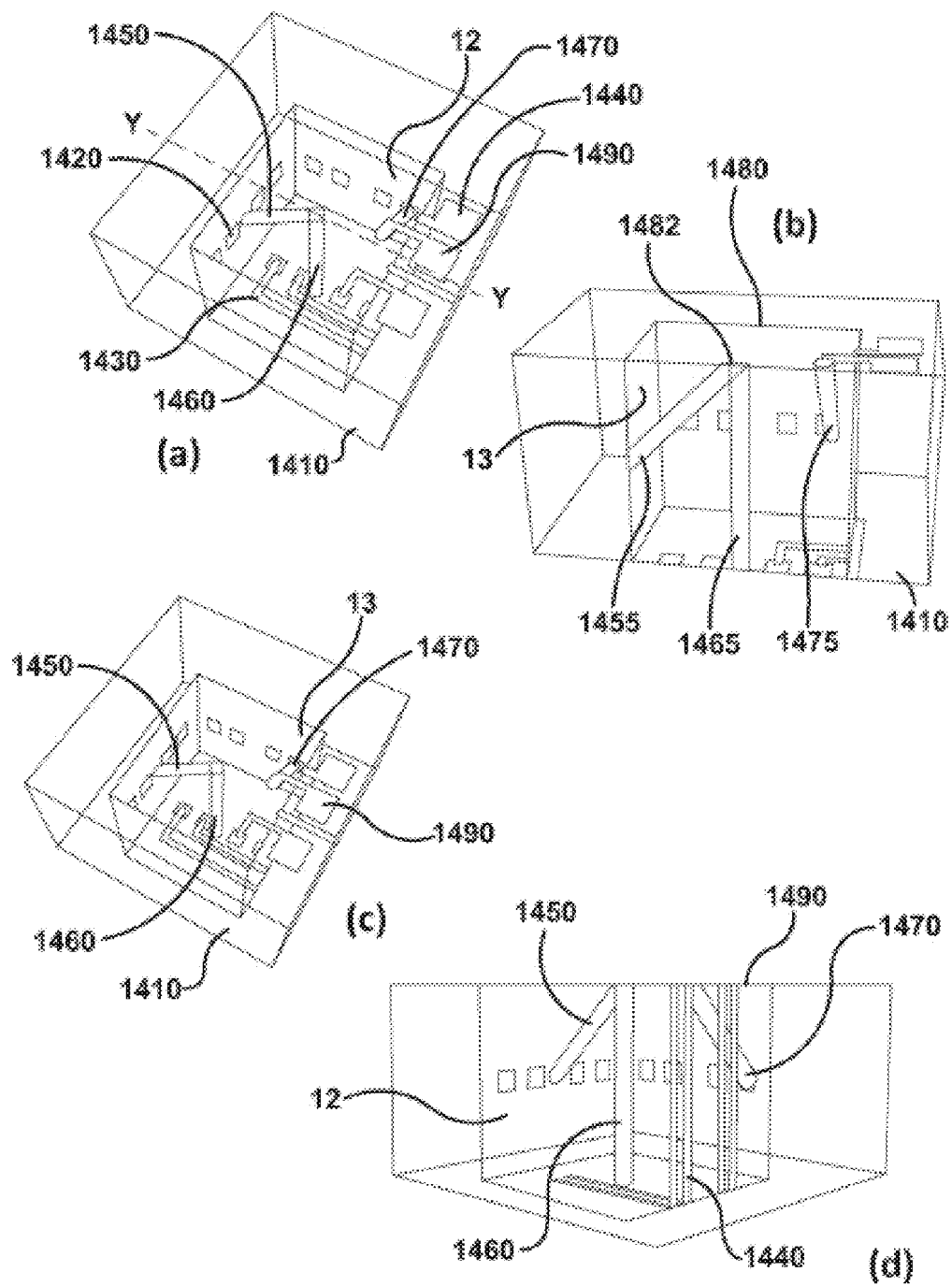
FIG. 14 illustrates formation of one or more interconnects being undertaken with an MPL technique, according to an embodiment.

FIGS. 14*a-d* illustrate an approach of applying the 3D manufacturing technique to facilitate the formation of interconnects, according to an embodiment. FIG. 14*a* illustrates a final structure comprising a matrix material 1410, into which has been formed a cavity 12, and in which various structures such as a source/drain structure 1420, a plurality of planar interconnects 1430, and a plurality of connectors 1440 have been formed, as previously described. The final structure illustrated in FIG. 14*a* also includes a plurality of interconnects 1450, 1460, and 1470 in conjunction with a connector 1490 which has been formed to extend to connect to interconnect 1470. As shown, the interconnects 1450 and 1470 have been diagonally formed while interconnect 1460 extends vertically, where in an embodiment, interconnect 1460 can act as a support or hitching post for interconnect 1450.

Interconnects 1450, 1460, and 1470 can be formed as a result of forming vias in a backfill material 13. In the previous embodiments presented herein, the backfill material 13 can be utilized to support formation of a membrane material (e.g., membrane 14), whereupon, once the membrane material has been formed and an opening (e.g., opening 16) formed in the membrane material, the backfill material is removed through the opening. In the alternative embodiment presented in FIGS. 14*a-d*, rather than removing the backfill material to form cavity 12, openings (such as via openings 1455, 1465, and 1475) can be extended into the backfill material 13, as shown in FIG. 14*b*, which is a section across Y-Y of FIG. 14*a*. The via openings can be formed by a sequence of operations including forming a membrane 1480, forming an opening 1482 in the membrane 1480, forming the via, and removal of the membrane 1480. Hence, for example, the via openings 1455 and 1465 can be formed from a single opening with via opening 1455 being formed at an angle while via opening 1465 is formed vertically. Further, a second opening can be formed to facilitate formation of via opening 1475.

The via openings 1455, 1465, and 1475 can be subsequently filled with material such as a conductor, as shown in FIG. 14*c*. Furthermore, connector 1490 can be formed on the surface of the backfill material 13, whereby connector 1490 can extend from the matrix material 1410 to connect with the interconnect formed in the via opening 1475.

As shown in FIGS. 14*a* and 14*d*, the backfill material 13 and the membrane can be removed to leave interconnects 1450, 1460, and 1470 formed in the cavity space 12, with interconnect 1470 connected to connector 1490 which extends over the cavity 12. With the approach presented in FIGS. 14*a-d*, as illustrated, it is possible to form interconnects in 3D space (e.g., in cavity 12) which can enable local routing of interconnects in the unit cell volume. In a conventional 2D approach, the ability to place/form interconnects between transistors, etc., is limited to routing connections through higher and higher levels of metal. Application of 3D diagonal interconnects have, at best, limited application in a conventional 2D IC structure, but with the 3D approach presented herein, an excavated volume of a cavity can be utilized as an interconnect space, rather than being limited to the exposed surface of an active silicon layer with a 2D approach.

Figure 15:
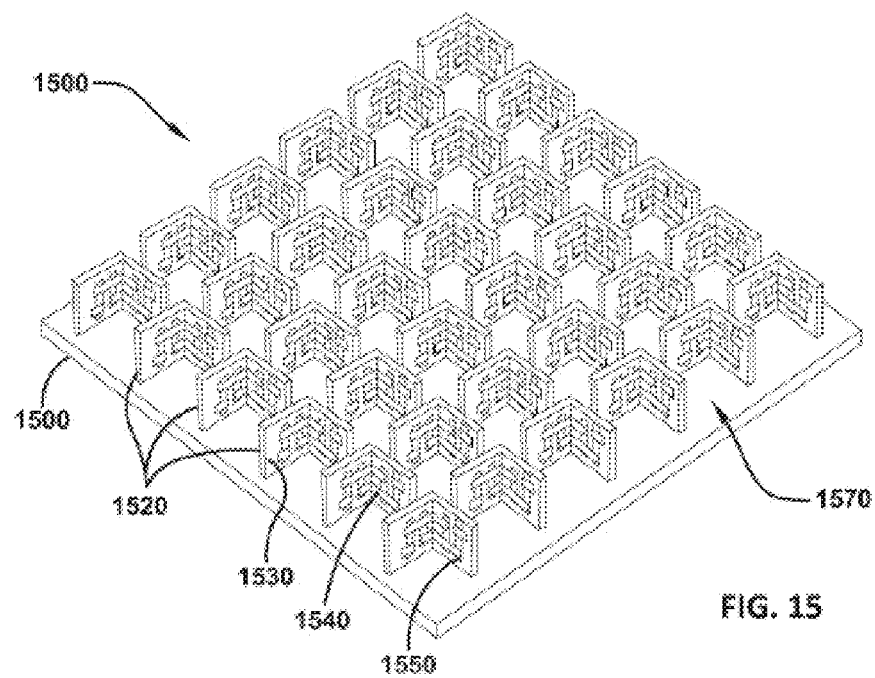
FIG. 15 illustrates formation of 3D structure comprising a plurality of fins, according to an embodiment.
Figure 16:
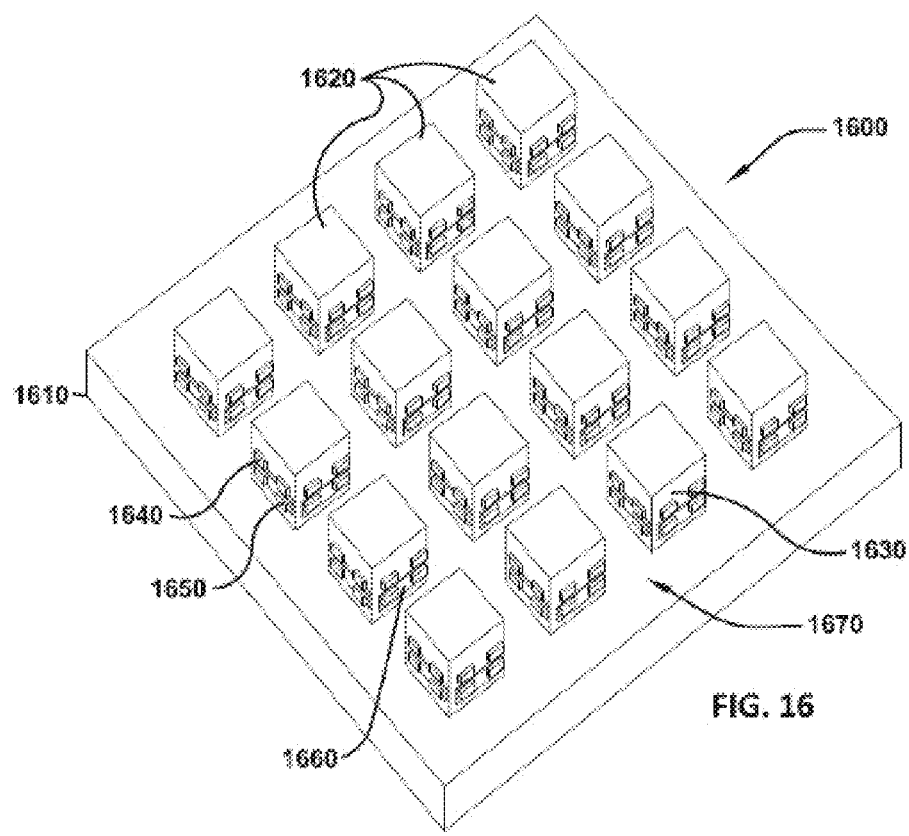
FIG. 16 illustrates formation of 3D structure comprising a plurality of pillars, according to an embodiment.

Further, as illustrated in FIGS. 15 and 16, while the previous embodiments have related to the formation of 3D structures in a cavity (e.g., cavity 12), 3D structures can also be formed on the surfaces of fins, pillars, etc. For example, fins 1520 and pillars 1620 can be formed from matrix material on respective substrates 1510 and 1610. Hence, rather than forming cavities (e.g., cavity 12), in a matrix material, fins 1520 can be formed by building up the fin material or patterning a matrix material to form the fins. Similarly, pillars 1620 can be formed by building them with matrix material or patterning the matrix material. A series of operations can be performed comprising of filling the trenches 1570 and 1670 between the respective fins 1520 and pillars 1620 with backfill material (e.g., backfill material 13), forming a membrane thereover (e.g., membrane layer 14), forming an opening (e.g., opening 16) in the membrane and subsequently forming the desired structure(s), where the series of operations can be repeated as necessary to facilitate formation of a final required structure. On the surface 1530 of the fins 1520, gate structures 1540 and drain structures 1550 can be formed, while on the exterior surfaces 1630 of the pillars 1620 structures 1640, 1650, and 1660 can be formed. It is to be appreciated that while the various embodiments illustrated herein depict pillars 1620 having a cubic profile/structure, the embodiments are not so limited and the pillar can be formed to any desired shape such as curved, cylindrical, spherical, ellipsoidal, prismatoidal, conic, etc. Similarly, while the fins 1520 are shown having a rectangular profile/structure, other shaped fins can be equally formed.

Based on the foregoing, it is to be appreciated that the various embodiments presented herein can be extended such that unit cells can be formed comprising any of a cavity, a fin, or a pillar, with required 3D structures and interconnects formed thereon. Furthermore, the possible device materials can include deposited polycrystalline silicon. For example, in the field of thin film transistors (TFT), a layer of polycrystalline silicon can be deposited on a structural substrate which may not be electrically useful (for example, a polymer, a glass, etc.) and transistors can then be subsequently formed in the polycrystalline silicon layer. Transistors formed with polycrystalline silicon can have inferior performance to those transistors formed with single crystal, monocrystalline silicon, but a requirement to form the transistors on a semiconductor substrate can be negated. Hence, by utilizing the various embodiments presented herein, it is possible to deposit a first layer of polysilicon, form a first layer of transistors (or other active devices), deposit a second layer of polysilicon over the first layer of transistors, form a second layer of transistors on the second layer of polysilicon, deposit a third layer of polysilicon, etc., to facilitate formation of a 3D volume of 3D devices.

Figure 17:
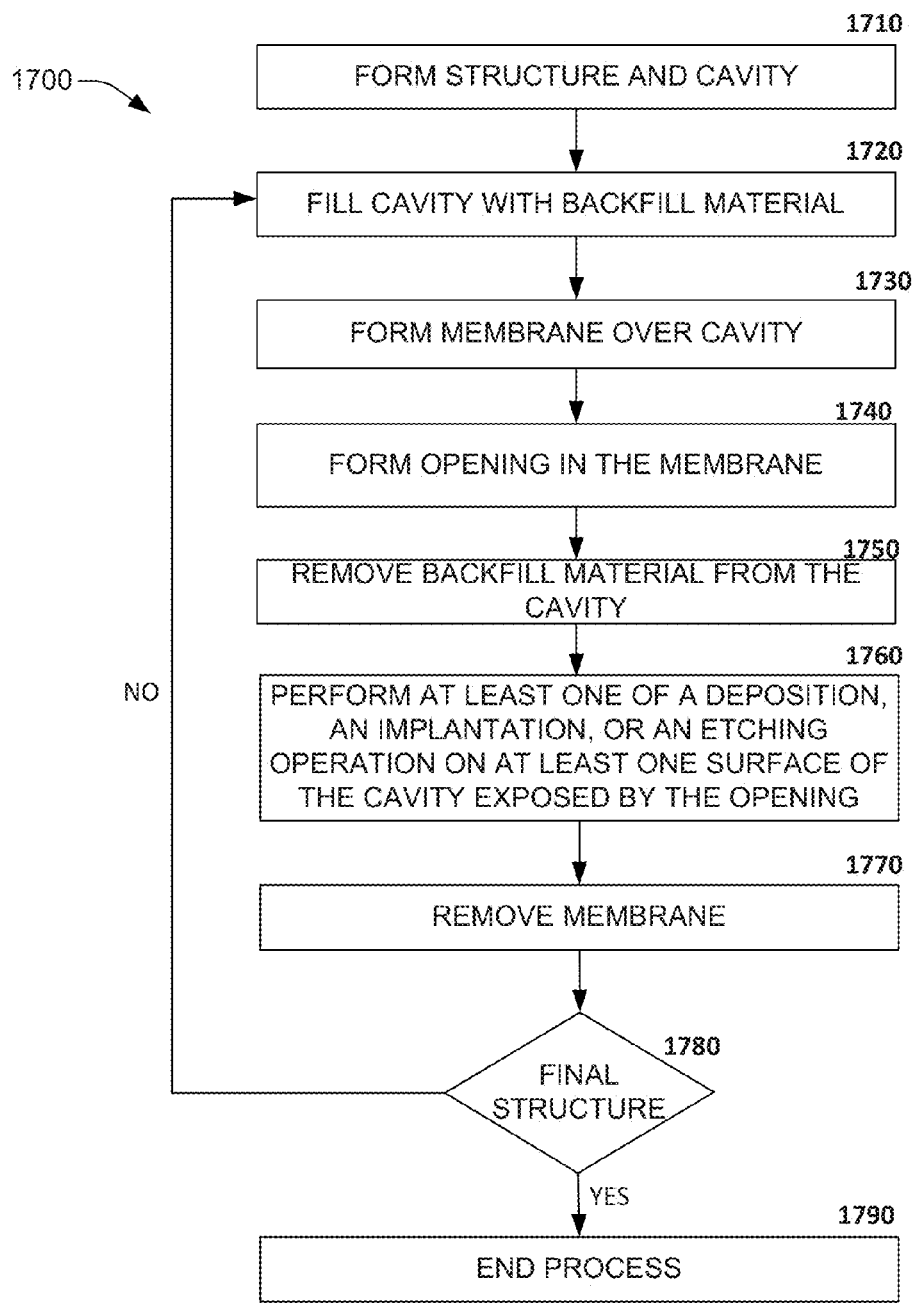
FIG. 17 is a flow diagram illustrating an exemplary methodology for forming a 3D structure.

FIG. 17 is a methodology 1700 relating to a 3D manufacturing technique. While the methodology 1700 is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

At 1710, a base structure can be formed. For example, a transistor structure can comprise of Si, or other suitable material, to act as a 3D substrate (e.g., a matrix material) onto which desired structures, e.g., a gate, a source, a drain, interconnect, metal line, etc., can be formed. As previously described, a cellular structure can be formed, whereby a cavity can be formed in each unit cell of the substrate material. The cavity can either be formed by any suitable technique such as by etching the cavity, deposition of bottom and side walls to form a cavity (e.g., via lithographically or otherwise), etc.

At 1720, a sacrificial backfill material can be deposited into the cavity and further planarized to support membrane layer to be subsequently formed thereon. The sacrificial backfill material can be later selectively removed using any suitable technique such as an etching or dissolution mechanism, whereby the suitable technique is a material selective technique configured to not affect either the membrane or the substrate material comprising the cavity walls and base.

At 1730, a membrane layer can be deposited on the planarized backfill material. The membrane layer material can be later removed with a selective etchant. A release layer can be deposited prior to deposition of the membrane layer on the planarized backfill material to enable subsequent removal, lift off, of the membrane.

At 1740, the membrane layer can be patterned, e.g., with standard lithographic techniques, to provide an opening in the membrane layer, where the opening in conjunction with the remaining membrane mask acts as a mask. The opening can be formed such that it images the desired structure (e.g., a gate, a drain, a source, an interconnect, etc.) to be subsequently formed on at least one of the cavity sidewalls and/or the bottom surface of the cavity.

At 1750, the sacrificial backfill material can be removed through the opening to facilitate reformation of the cavity underneath the patterned membrane layer.

At 1760, at least one of a material deposition operation, an implantation operation, and/or a material removal operation (e.g., an etching operation) can be performed as required to form the required structure. For example, the opening in the membrane can be of a dimension/shape required as a mask, and hence form the required structure such as an implanted n-well, an implanted NMOS source/drain, a PMOS source/drain, a deposited oxide layer, a hole etched in a layer, a deposition to form an interconnect, etc., as described herein. As mentioned, by adjusting the position of a source, e.g., an ion implantation beam, relative to the opening and an underlying surface (e.g., any of the cavity sidewalls, the bottom surface of the cavity, etc.) more than one structure can be formed for a single instance of a membrane layer.

At 1770, once the required structure(s) have been formed by any of deposition, implantation, etching, etc., the membrane layer can be removed.

At 1780, a determination can be made regarding whether the final overall structure has been achieved (e.g., the structure depicted in any of FIG. 1, structure 36; FIG. 5; FIGS. 7A-7D; FIG. 6L; FIG. 8; FIG. 9; FIG. 11; FIG. 12; FIG. 14a; FIG. 14d; FIG. 15; FIG. 16; etc.). In the event of a further structure(s) is to be formed (e.g., by any of deposition, implantation, etching, etc.) the methodology can return to 1720 whereby the cavity can be refilled with backfill material, a new membrane layer formed thereon and patterned in accord with the next required structure to be formed, etc.

At 1790, in the event of at 1780, the final structure has been achieved, the final membrane layer can be removed and subsequent processing of the transistor can be undertaken as required.

Figure 18:
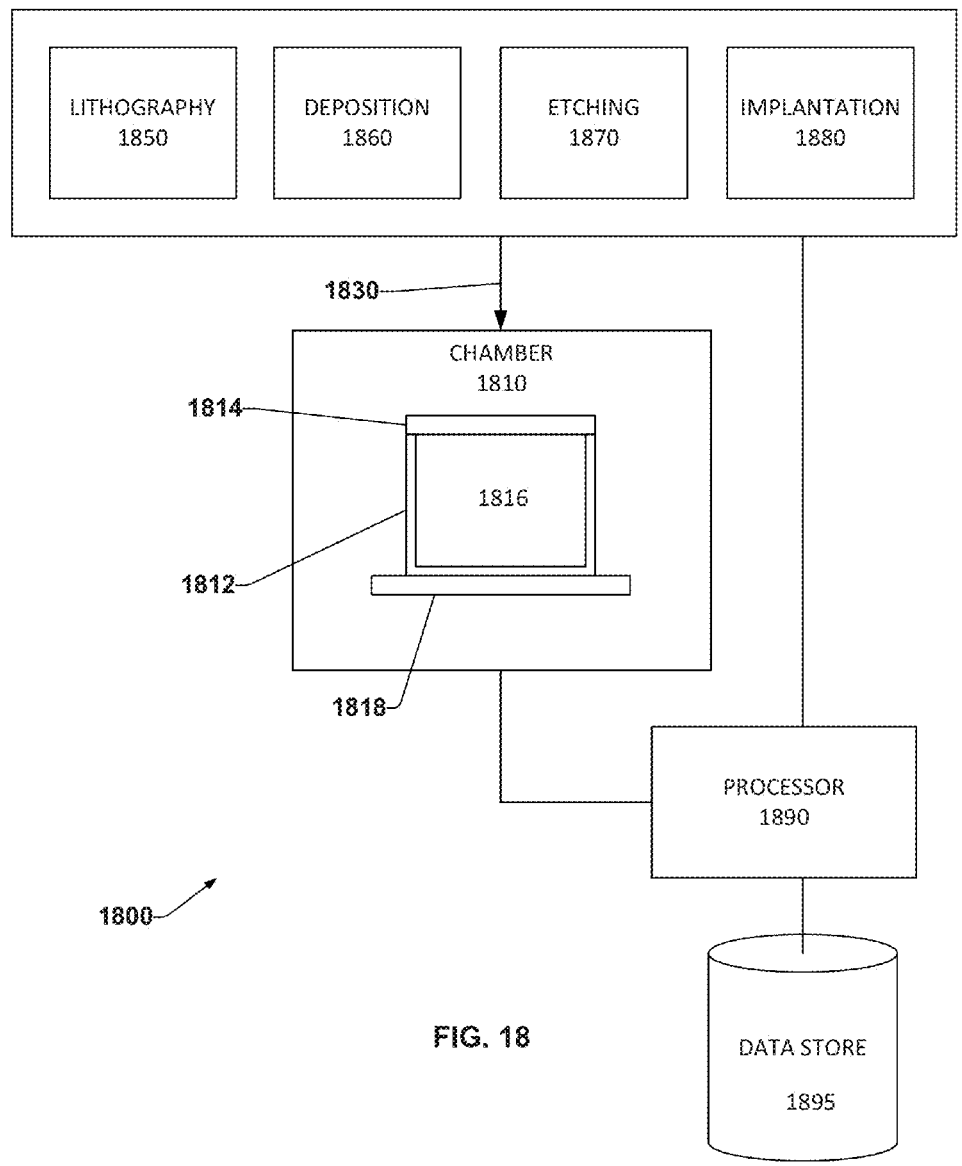
FIG. 18 illustrates a system for forming a 3D structure according to an embodiment.

FIG. 18 illustrates a system 1800 comprising a 3D manufacturing system, according to an embodiment. Located in operating chamber 1810 is a cell matrix comprising one or more cells formed from matrix material 1812 around a cavity 1816 and a membrane layer 1814 formed over the matrix material 1812 and cavity 1816, as previously described. Chamber 1810 can be any standard apparatus as utilized for the production of semiconductor devices, e.g., chamber 1810 can be a vacuum apparatus as utilized in the production of CMOS components, etc. Chamber 1810 includes a support structure 1818 upon which the cell is located. In accord with an embodiment, support structure 1818 can be rotated as well as tilted to facilitate placement of the membrane layer 1814 at a position required for a structure to be formed in an inner wall of cavity 1816. For example, with reference to FIG. 13, the membrane layer 1814 (and according position of matrix material 1812 and cavity 1816) can be positioned relative to a beam 1830 to facilitate formation of each structure, where the beam 1830 can be any of 1372, 1374, 1376, 1378 or 1380. Depending upon the operation, beam 1830 can be associated with any of a lithographic component 1850, a deposition component 1860, an etching component 1870, or an implantation component 1880.

Each component 1850-1880 can include any necessary apparatus, material(s), processor and/or control logic to facilitate generation of a beam of material required to facilitate formation of one or more structures on the wall(s) of cavity 1816. Further, system 1800 can include a processor 1890 in association with a data store 1895. Processor 1890 can control operation of one or more components of the system 1800 to facilitate formation of the one or more structures on the wall(s) of cavity 1816. For example, processor 1890 can control lithographic component 1850 to facilitate formation of an opening in the membrane layer 1814, whereby the processor 1890 can further control the position of support structure 1818 to enable correct placement of the membrane 1814 relative to a lithographic operation being conducted on beam alignment 1830. In a subsequent operation (e.g., any of a deposition operation, an etching operation, an implantation operation) processor 1890 can control respective operation of components 1860-1880 and also placement of the cell matrix material 1812/membrane 1814. Operating instructions such as required positioning for a sequence of structure forming operations can be stored in data store 1895 for retrieval by processor 1890.

Figure 19:
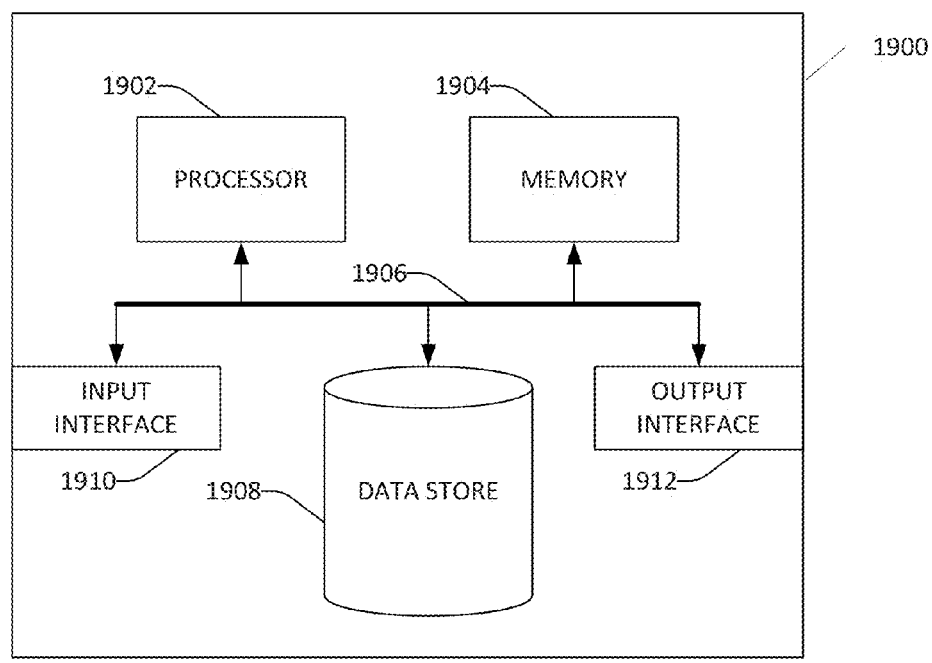
FIG. 19 illustrates an exemplary computing device.

Referring now to FIG. 19, a high-level illustration of an exemplary computing device 1900 that can be used in accordance with the systems and methodologies disclosed herein is illustrated. For instance, the computing device 1900 may be used to control a 3D manufacturing operation comprising one or more components comprising system 1800, e.g., processor 1890, etc. The computing device 1900 includes at least one processor 1902 that executes instructions that are stored in a memory 1904. The instructions may be, for instance, instructions for implementing functionality described as being carried out by one or more components discussed above or instructions for implementing one or more of the methods described above. The processor 1902 may access the memory 1904 by way of a system bus 1906. In addition to storing executable instructions, the memory 1904 may also store operating parameters, required operating parameters, and so forth.

The computing device 1900 additionally includes a data store 1908 that is accessible by the processor 1902 by way of the system bus 1906. The data store 1908 may include executable instructions, operating parameters, required operating parameters, etc. The computing device 1900 also includes an input interface 1910 that allows external devices to communicate with the computing device 1900. For instance, the input interface 1910 may be used to receive instructions from an external computer device, from a user, etc. The computing device 1900 also includes an output interface 1912 that interfaces the computing device 1900 with one or more external devices. For example, the computing device 1900 may display text, images, etc., by way of the output interface 1912.

Additionally, while illustrated as a single system, it is to be understood that the computing device 1900 may be a distributed system. Thus, for instance, several devices may be in communication by way of a network connection and may collectively perform tasks described as being performed by the computing device 1900.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. The terms "component" and "system" are also intended to encompass hardware configured to cause certain functionality to be performed, where such hardware can include, but is not limited to including, Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

In view of the foregoing description, a 3D manufacturing is presented which can provide any of the following benefits: an increased transistor density for a given area compared with a conventional 2D plane operation. For example, rather than a transistor being formed on the bottom layer of a cell (an equivalent structure to a 2D plane structure) further transistors can be formed on any of the four sidewalls of the cavity such than the 3D manufacturing approach described herein can facilitate formation of two, three, four, or five transistors in an area of about the same planar dimension as a transistor formed with the conventional 2D approach. Further, the various embodiments presented herein are CMOS compatible and hence can make use of current standard CMOS processing equipment. Furthermore, all lithographic patterning occurs on a planar substrate (e.g., the membrane layer) and hence, depth of focus issues which plague conventional lithography are negated. And further, as previously described, a 3D IC is likely more difficult to reverse engineer because the formed structure/circuitry is distributed in a volume rather than a plane, thereby thwarting a polish/analyze method of attack.

Throughout the description, the term substrate is indicated to be the base layer upon which the various subsequent layers, nFET and pFET, resists, gate structures, channels, etc., are formed. The substrate can comprise of any suitable material, such as Si, Si-compound, etc., which can be subsequently doped to form respective nFET and pFET regions, etc.

The various layers presented in the foregoing can be formed/deposited by any suitable process such as a thermal processing, phase conversion, spin coating, deposition, CVD process, for example, low pressure chemical vapor deposition (LPCVD), plasma enhanced chemical vapor deposition (PECVD), molecular-beam epitaxy (MBE), liquid-phase epitaxy (LPE), vapor-phase epitaxy (VPE), solid-phase epitaxy (SPE), deposition doping, etc.

Any suitable technique can be used to pattern any of the material layers presented herein, (e.g., to form a nFET gate, a pFET gate, etc.). For example, patterning can be created by employing, for example, a photoresist which can be patterned using standard photolithographic techniques to form the required pattern in the membrane layer 14 to create the gate, source, drain, interconnects, etc., wherein the photoresist is exposed to electromagnetic radiation through a mask having an image pattern of a desired layout (e.g., desired trenches, openings, line patterning, etc.). Openings are then formed in the photoresist, and subsequently the membrane layer, in order to form the desired layout, e.g., by etching away the exposed material (in the case of a positive photoresist) or etching away the unexposed material (in the case of a negative photoresist). Depending on the material of the photoresist, exposure can create a positive or a negative. With a positive photoresist, exposure causes a chemical change in the photoresist such that the portions of the photoresist layer exposed to light become soluble in a developer. With a negative photoresist, the chemical change induced by exposure renders the exposed portions of the photoresist layer insoluble to the developer. After exposure and development, an opening according to the desired pattern is formed in the membrane layer. A subsequent processing step, such as a deposition step, an etching step, an ion implantation step, etc., can be performed and controlled according to the opening. The photoresist can be subsequently removed. Etching can be by any viable dry or wet etching technique. For example, a wet or dry etching technique can be employed for patterning, while in another aspect, etching can be by a specific anisotropic etch.

Any etching/material removal technique is applicable to the various embodiments, as described herein. Wet etching can be utilized to remove a particular layer (e.g., the backfill material 13) where a given layer may be susceptible to etch by a particular etchant while a neighboring layer is not (e.g., selective etching utilized to remove the backfill material leaves the cell material 10 intact). In another example, anisotropic etching techniques can be utilized to control material removal in a specific direction.

Levelling of layers after formation can be by any suitable technique, e.g., by CMP or other suitable process, to achieve a given dimension, in preparation for the next stage in creation of the 3D structure.

Stripping of a resist layer (e.g., any of membrane layers 14, 210, 610, 620, 630, 650, 660, or 940) involves the removal of unwanted resist from the 3D structure, while preventing removal of underlying layers and materials. Any suitable stripper can be utilized as required, such as organic stripper, inorganic stripper, dry stripping, etc. In another example, chemical mechanical polishing or other physical removal process can be used to remove the membrane.

It is to be appreciated that while the formation of gate structures, source/drain regions, etc., are described, there may be certain procedures that are not fully disclosed during description of the various embodiments as presented herein. However, rather than provide description of each and every operation involved in the various operations facilitating formation, patterning, removal, etc., of each structure presented herein, for the sake of description only the general operations are described. Hence, while no mention may be presented regarding a particular operation pertaining to aspects of a particular figure, it is to be appreciated that any necessary operation, while either not fully disclosed, or not mentioned, to facilitate formation/deconstruction of a particular layer/element/aspect presented in a particular figure is considered to have been conducted. For example, while no mention may be made regarding a layer described in a preceding figure being leveled (e.g., by CMP, or other suitable operation) it is considered, for the sake of readability of the various exemplary embodiments presented herein, that the leveling process occurred, as have any other necessary operations. It is appreciated that the various operations, e.g., leveling, CMP, patterning, photolithography, deposition, implantation, layer formation, etching, etc., are well known procedures and are not necessarily expanded upon throughout this description.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A method, comprising:
    forming a first structure in a cavity in a matrix material, wherein the first structure is formed by one of a first deposition operation, a first implantation operation, or a first etching operation performed through a first opening in a first membrane layer formed over the cavity and the first structure is formed on an inner wall surface of the cavity; and
    forming a second structure on the first structure, wherein the second structure is formed by one of a second deposition operation, a second implantation operation, or a second etching operation performed through a second opening in a second membrane layer formed over the cavity.

2. The method of claim 1, further comprising:
    forming the cavity in the matrix material;
    depositing a first sacrificial backfill material into the cavity;
    planarizing the surface of the first sacrificial backfill material;
    depositing the first membrane layer onto the planarized surface of the first sacrificial backfill material;
    patterning the first membrane layer to form the first opening; and
    removing the first sacrificial backfill material through the first opening to facilitate reopening of the cavity.

3. The method of claim 2, further comprising:
    after forming the first structure, removing the first membrane layer.

4. The method of claim 3, further comprising:
    depositing a second sacrificial backfill material into the cavity;
    planarizing the surface of the second sacrificial backfill material;
    depositing the second membrane layer onto the planarized surface of the second sacrificial backfill material;
    patterning the second membrane layer to form the second opening; and
    removing the second sacrificial backfill material through the second opening to facilitate reopening of the cavity.

5. The method of claim 1, further comprising forming a third structure in the cavity, wherein the third structure is formed by one of a third deposition operation, a third implantation operation, or a third etching operation performed through the first opening in the first membrane layer formed over the cavity and the third structure is formed on an inner wall surface of the cavity disparate to the inner wall surface of the cavity on which the first structure is formed.

6. The method of claim 5, wherein a beam direction of material being utilized in the one of the third deposition operation, the third implantation operation, or the third etching operation relative to the first opening is disparate to a beam direction of material being utilized in the one of the first deposition operation, the first implantation operation, or the first etching operation.

7. The method of claim 1, wherein the matrix material is at least one of photoresist, semiconductor, or dielectric.

8. The method of claim 1, wherein the first structure is formed as a function of forming a semiconductor device.

9. The method of claim 1, wherein at least one of the first membrane layer or the second membrane layer comprises at least one of photoresist, silicon, silicon dioxide, silicon nitride, or metal.

10. The method of claim 4, wherein at least one of the first sacrificial backfill material or the second sacrificial backfill material comprises silicon, silicon dioxide, polyimide, or photoresist.

11. The method of claim 1, wherein the cavity comprises a curved, cylindrical, spherical, ellipsoidal, cubic, prismatoidal, or conic shape.

12. The method of claim 1, further comprising depositing the matrix material on a substrate prior to forming the first patterned membrane over the cavity.

13. The method of claim 1, wherein at least one of the first structure or the second structure comprises a metal or dielectric.

14. The method of claim 1, wherein the cavity is formed by either etching a void in the matrix material or by depositing matrix material to form a bottom and side walls of the cavity.

15. A method, comprising:
forming a patterned membrane layer over a cavity in a matrix material, wherein the patterned membrane layer comprises at least one mask opening; and
directionally forming at least one structure on an inner wall surface of the cavity through the at least one mask opening in the patterned membrane layer to reproduce the pattern on the inner wall surface, wherein the forming of the at least one structure is one of implanting material into the inner wall surface or removing material from the inner wall surface.

16. The method of claim 15, wherein the forming of the patterned membrane over the cavity further comprises forming the patterned membrane over the matrix material and etching the cavity through the at least one mask opening.

17. The method of claim 16, wherein the forming of the patterned membrane over the cavity further comprises:
forming an initial cavity in the matrix material;
depositing a sacrificial backfill material into the initial cavity;
planarizing the surface of the deposited sacrificial backfill material;
depositing the membrane layer onto the planarized surface of the sacrificial backfill material;
patterning the membrane layer to form the at least one mask opening; and
removing the sacrificial backfill material through the at least one mask opening.

18. A computer-readable storage medium comprising instructions that, when executed by a processor, cause the processor to perform acts comprising:
transmitting at least one control signal to at least one of a deposition component, an implantation component, or an etching component, the at least one control signal including data relating to:
forming a first structure in a cavity, wherein the first structure is formed by one of a first deposition operation, a first implantation operation, or a first etching operation and the first structure is formed on an inner wall surface of the cavity; and
forming a second structure on the first structure, wherein the second structure is formed by one of a second deposition operation, a second implantation operation, or a second etching operation,
wherein the first deposition operation, the first implantation operation, or the first etching operation are conducted by directing one of deposition material, implanting material, or an etchant through at least one opening formed in a first patterned membrane layer located over the cavity, the opening reproducing the pattern on the inner wall surface, and the second deposition operation, the second implantation operation, or the second etching operation are conducted by directing one of deposition material, implanting material, or an etchant through at least one opening formed in a second patterned membrane layer located over the cavity, the opening reproducing the pattern on the inner wall surface.

19. The computer-readable storage medium of claim 18, wherein after the first structure is formed the first patterned membrane is removed from over the cavity, and the second patterned membrane is subsequently formed over the cavity to facilitate formation of the second structure.

* * * * *